United States Patent
Doris et al.

(10) Patent No.: US 7,935,588 B2
(45) Date of Patent: May 3, 2011

(54) ENHANCED TRANSISTOR PERFORMANCE BY NON-CONFORMAL STRESSED LAYERS

(75) Inventors: Bruce B. Doris, Brewster, NY (US); Xiao Hu Liu, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/682,554

(22) Filed: Mar. 6, 2007

(65) Prior Publication Data

US 2008/0217663 A1 Sep. 11, 2008

(51) Int. Cl.
*H01L 21/8234* (2006.01)

(52) U.S. Cl. .............................. 438/197; 257/E21.424

(58) Field of Classification Search .................. 257/213, 257/288, 368, 369, E21.409, E21.424; 438/142, 438/197, 199, 299, 300, 303
See application file for complete search history.

(56) References Cited

U.S. PATENT DOCUMENTS

| | | | |
|---|---|---|---|
| 6,977,194 B2 | 12/2005 | Belyansky | 438/197 |
| 7,002,209 B2 | 2/2006 | Chen | 257/336 |
| 7,105,394 B2 | 9/2006 | Hachimine | 438/197 |
| 7,115,954 B2 | 10/2006 | Shimizu | 257/369 |
| 7,205,615 B2 | 4/2007 | Tsutsui | 257/369 |
| 7,223,647 B2 | 5/2007 | Hsu | 438/199 |
| 2005/0158955 A1* | 7/2005 | Yang et al. | 438/282 |
| 2006/0057787 A1 | 3/2006 | Doris | 438/153 |
| 2006/0249794 A1* | 11/2006 | Teh et al. | 257/369 |
| 2007/0077765 A1* | 4/2007 | Prince et al. | 438/694 |
| 2007/0096220 A1* | 5/2007 | Kim et al. | 257/382 |

OTHER PUBLICATIONS

"High speed 45 nm gate length CMOSFETs integrated into a 90nm bulk technology incorporating strain engineering" V. Chan et al., IEDM Tech. Dig., pp. 77-80, 2003.
"Dual stress liner for high performance sub-45nm gate length SOI CMOS manufacturing" H..S. Yang, et al., IEDM Tech. Dig., pp. 1075-1078, 2004.

\* cited by examiner

*Primary Examiner* — Minh-Loan T Tran
*Assistant Examiner* — Kevin Quinto
(74) *Attorney, Agent, or Firm* — George Sai-Halasz; Louis J. Percello

(57) ABSTRACT

NFET and PFET devices with separately strained channel regions, and methods of their fabrication is disclosed. A stressing layer overlays the device in a manner that the stressing layer is non-conformal with respect the gate. The non-conformality of the stressing layer increases the amount of stress that is imparted onto the channel of the device, in comparison to stressing layers which are conformal. The method for overlaying in a non-conformal manner includes non-conformal deposition techniques, as well as, conformal depositions where subsequently the layer is turned into a non-conformal one by etching.

4 Claims, 6 Drawing Sheets

ENHANCED TRANSISTOR PERFORMANCE BY NON-CONFORMAL STRESSED LAYERS

FIELD OF THE INVENTION

The present invention relates to electronic devices. In particular, it relates to FET devices with enhanced performance due to their channel region being under tensile or compressive stress.

BACKGROUND OF THE INVENTION

Today's integrated circuits include a vast number of devices. Smaller devices and shrinking ground rules are the key to enhance performance and to reduce cost. As FET (Field-Effect-Transistor) devices are being scaled down, the technology becomes more complex, and changes in device structures and new fabrication methods are needed to maintain the expected performance enhancement from one generation of devices to the next. The mainstay material of microelectronics is silicon (Si), or more broadly, Si based materials. One such Si based material of importance for microelectronics is the silicon-germanium (SiGe) alloy.

There is a great difficulty in maintaining performance improvements in devices of deeply submicron generations. Therefore, methods for improving performance without scaling down have become of interest. One general approach for improving performance is to increase carrier (electron and/or hole) mobilities in FETs. A promising avenue toward better carrier mobility is to modify the semiconductor where the current conduction takes place. It has been known, and recently further studied, that tensilely or compressively stressed semiconductors have intriguing carrier properties. In particular, improvement in the electron mobility has been achieved in a silicon (Si) channel NFET under tensile stress, as described in U.S. Pat. No. 6,649,492 B2 to J. O. Chu entitled "Strained Si Based Layer Made By UHV-CVD, and Devices Therein" incorporated herein by reference. Similarly for hole enhancement, compressively-stressed Si and SiGe have yielded high hole mobilities. Combination of tensilely and compressively stressed SiGe regions in the same wafer have been already described in patents and the technical literature, for instance, in U.S. Pat. No. 6,963,078 to J. O. Chu "Dual Strain-State SiGe Layers for Microelectronics", and "High speed 45 nm gate length CMOSFETs integrated into a 90 nm bulk technology incorporating strain engineering" V. Chan et al., IEDM Tech. Dig., pp. 77-80, 2003, and "Dual stress liner for high performance sub-45 nm gate length SOI CMOS manufacturing" Yang, H. S., IEDM Tech. Dig., pp. 1075-1078, 2004, all three of these incorporated herein by reference.

Optimally, one would like to have integrated circuits such that the channel of electron conduction type devices, such as NFET, is tensilely stressed, while the channel of hole conduction type devices, such as PFET, are compressively stressed. However, global approaches in employing stress to enhance performance, such as the use of SiGe alloys, have problems with defected materials. Accordingly, so called locally induced stress approaches have been introduced more recently. In these, stress with the appropriate sign is introduced into the channel by means that are local to the device structures, for instance, by using the gate to impart stress into the channel as described in U.S. Pat. No. 6,977,194 to Belyansky et al. entitled "Structure and method to improve channel mobility by gate electrode stress modification" incorporated herein by reference. In other local approaches, stressed conformally deposited dielectric layers are utilized. Unfortunately, all the techniques used to date for achieving such stressed channels lack full satisfaction, either due to their complexity, or due to their relative ineffectiveness.

SUMMARY OF THE INVENTION

In view of the discussed difficulties, embodiments of the present invention disclose a NFET device in which the channel region is in tensile state of stress, and a PFET device in which the channel region is in compressive state of stress. A field effect transistor (FET) is disclosed which includes a gate, a source and a drain, where the gate overlays a channel. The channel is hosted in a single crystal material. A stressing layer overlays the FET in a non-conformal manner with respect to the gate, having at least over a portion of the sides of the gate, a side thickness which is less than about 50% of the thickness of the stressing layer over the source and the drain. The stress from the stressing layer is imparted into the channel of the FET. The stress in the stressing layer has the same sign as the stress in the channel. Typically, the stressing layer applied to NFET devices is under tensile stress, and the stressing layer applied to PFET devices is under compressive stress. The dielectric layer applied to both the NFET and PFET devices may be of the same material.

The invention further discloses a method for producing a FET with a stressed channel. The method includes the fabrication of a gate for the FET, which gate overlays a channel hosted in a single crystal material. The method further includes overlaying the FET with a stressing layer in such a manner that least over a portion of the sides of the gate the stressing layer has a side thickness which is less than about 50% of the thickness of the stressing layer over the source and the drain. Furthermore, the overlaying manner is such that the stressing layer imparts the stress onto the channel of the FET.

BRIEF DESCRIPTION OF THE DRAWINGS

These and other features of the present invention will become apparent from the accompanying detailed description and drawings, wherein.

DETAILED DESCRIPTION OF THE INVENTION

It is understood that Field Effect Transistor-s (FET) are well known in the electronic arts. Standard components of a FET are the source, the drain, the body in-between the source and the drain, and the gate. The body is usually part of a substrate, and it is often called substrate. The gate is overlaying the body and is capable to induce a conducting channel in the body between the source and the drain. In the usual nomenclature, the channel is hosted by the body. In most instances the gate is separated from the body by the gate insulator. There are two type of FET devices: a hole conduction type, called PFET, and an electron conduction type, called NFET. Often PFET and NFET devices are wired into CMOS circuits. A CMOS circuit contains at least one PFET and at least one NFET device. In manufacturing, or processing, when NFET and PFET devices are fabricated together on the same chip, one is dealing with CMOS processing and the fabrication of CMOS structures. High performance device bodies typically are of single crystal materials.

Figure 1A:
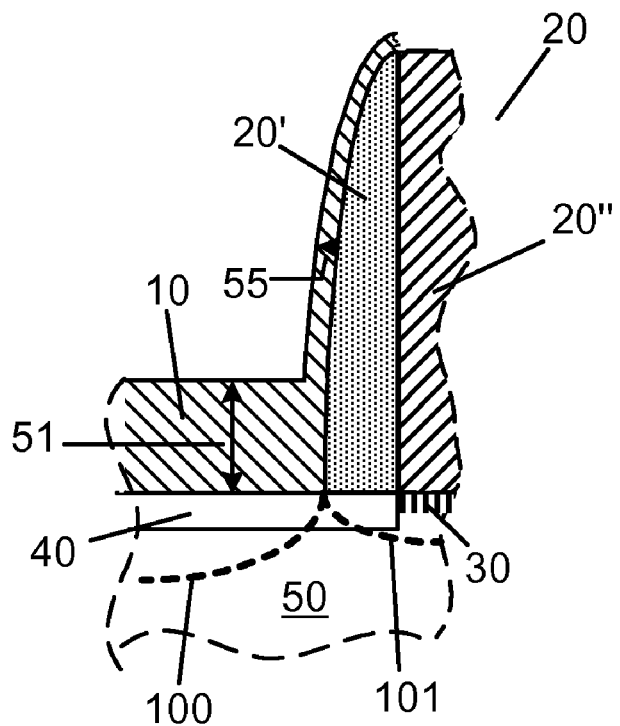
FIGS. 1A and 1B show a schematic of the details of representative embodiments of the invention.
Figure 1B:
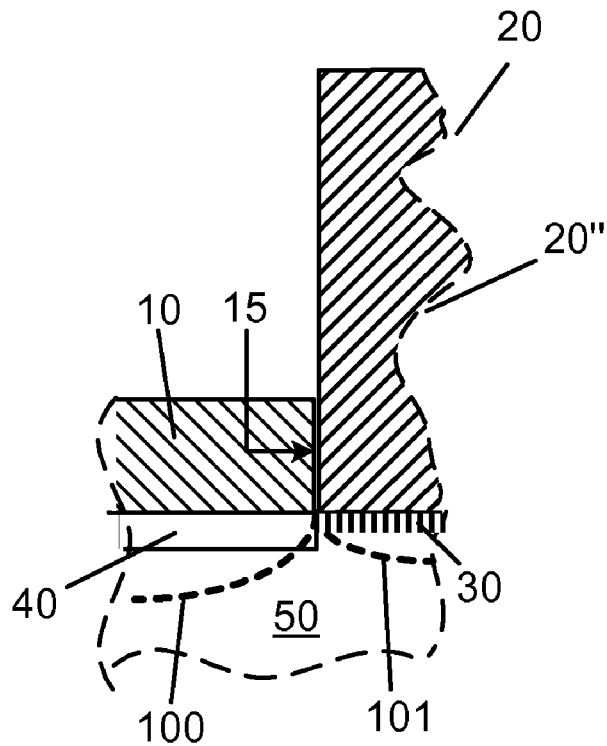

FIGS. 1A and 1B show schematic of the details of representative embodiments of the invention The figures exhibit only that portion of an FET which illustrates the structure and workings of an exemplary embodiment of the invention. FIGS. 1A and 1B are shown in terms of an NFET, however it is understood that a PFET could equally well serve the purpose.

In FIG. 1A the shown portion of the FET is at the edge of a gate 20. As know in the art there are many known ways to fabricate a gate, which often is a complex gate structure. Embodiments of the invention can be exercised with any gate that otherwise is best suited for device operation. In FIG. 1A, for illustration, two representative parts of a gate 20 are shown: a sidewall 20', and the conductive gate electrode 20". There could be more parts in a gate, or one may have a gate which only consist of the gate electrode 20" itself. The gate 20 overlays the channel 30 of the device. The channel 30, induced by the gate electrode 20", is typically hosted in a single crystal Si based material 50. In exemplary embodiments of the invention the Si based material 50 is essentially Si. The Si based material 50 which hosts the channel 30, in exemplary embodiments of the invention is the substrate 50.

Adjacent to the gate 20, a stressing layer 10 is overlaying the source or drain 40 of Si based material 50. The stressing layer 10 itself is under a significant amount of stress, which in the case of an NFET it is desirable to be a tensile stress. As one skilled in the art knows, the stress in the stressing layer 10 imparts stresses into the structures underlying it, such as the source or drain 40, and the substrate 50. Stress contours are shown with dashed lines. As it is known in the art, if the stressing layer 10 is under tensile stress, then the material which is directly underneath the stressed layer 10, is under compressive stress, as indicated by contour line 100. Where the layer 10 is not overlaying the source or drain 40 the stress changes sign and becomes tensile, as indicated by the contour line 101. Throughout this disclosure contour lines indicated as 100 are representing compressive stress, while those indicated as 101 are representing tensile stress. The change of sign in the stress occurs at the edge of the stressed layer as shown in FIG. 1A. For an NFET device the presence of a tensile stress 101 in the channel is the sought after desirable result. The direction of stress field in the channel is primarily in the longitudinal direction, meaning it is parallel with the current flow in the channel 30, which flow is in the plane of FIGS. 1A and 1B. The stress in the channel improves electron mobilities, and in general enhances electron current transport. Better electron transport leads to a higher performing NFET device. It is understood that the same holds for compressive stress in the case of a PFET device channel.

Inducing stress of a desirable kind in a channel of a FET device with stressing layers, has been known in the art. However, previous uses of stressing layers involved conformal layers. Conformal layers are such that when fabricated, their material deposits on surfaces independently of the orientation of a these surfaces. As such, they grow on vertical surfaces as well as on horizontal ones, showing no preference for growth direction. Conformality for the stressing layer 10 would mean that the surfaces surroundings of the gate, for instance, the source or drain 40, and the gate, including its side surfaces, would all covered by the stressing layer 10 to essentially the same thickness.

In embodiments of the present invention the stressing layer is non-conformal in regard to the gate. It was found that using a stressing layer in a non-conformal formation, when compared to a same stressing layer used in a conformal formation, increases significantly, up to twice, the amount of stress imparted onto the channel. This result was explored by extensive numerical simulations of stress fields, as well as, by directly measuring device currents as they improved due to the higher stress in the channel. Increases up to 25% the in linear mode drain current have been measured in FET devices due the non-conformal nature of the coverage by the stressing layer. Relative to a stressing layer which is conformal with the gate, simulations show that, the non-conformality of the stressing layer over the gate may be eliminating the vertical components of the stress, and enhancing the stress components in the plane of the channel.

In embodiments of the present invention, according to the teaching presented, one prefers full non-conformality of the stressing layer 10 over the gate 20. Ideal non-conformality of the stressing layer 10 would mean that the sidewalls of the gate 20 are free of any deposits of the stressing layer 10. However, embodiments of the present invention may tolerate a less than ideal non-conformal depositing of the stressing layer, resulting in some amount of coverage by the stressing layer over the sides of the gate, as indicted in FIG. 1A. On the sides of the gate 20 there is less coverage by the stressing layer than there is over the source or drain 40. When the coverage by the stressing layer 10 on the sides of the gate 20 is less than about 50% of the coverage over the source or drain 40, one is within the scope of the embodiments of the present invention.

The amount of coverage may be characterized by layer thickness. The stressing layer 10 has a thickness 51 over the source or drain 40. While, over at least a portion of the sides of the gate 20, the stressing layer has a side thickness 55, which is less than about 50% of the thickness 51 over the source and the drain. A layer thickness, over any point of a given surface, is typically defined as the extension of the layer perpendicularly to the surface at the point in question.

The portion of the sides of the gate 10, where the stressing layer 10 has a side thickness 55, or coverage, which is less than about 50% of the thickness 51 over the source and the drain, is typically above, or higher up, than the stressing layer itself. However, this is not necessary for all embodiments. It is possible for the thickness of the stressing layer 51 to be larger than a gate 20, 21 height. The stressing layer 10 has a thickness, which may be in the range of approximately between 30 nm and 150 nm, as would be measured over the source or drain 40. Accordingly, the term "above" a particular layer introduces a height hierarchy in which the surface of the substrate 50 would be the reference plane. The stressing layer reaches to a certain height, which is the thickness 51. The gate 20 is usually protruding out of the stressing layer 10, reaching higher away from the substrate 50, namely, to "above" the stressing layer 10. Particularly, in discussing the coverage on the sides of the gate, the portion of relevance on the side of the gate is that portion which is above a certain height, which height is larger than the thickness 51 of the stressing layer. Typically, the side of the gate above, as defined herein, is where that at least one portion of the side of the gate is located, over which portion the side thickness 55 of the stressing layer is less than about 50% of the stressing layer thickness 51.

FIG. 1B shows a preferred embodiment of the present invention in regard to two properties, shown again as NFET in the figure, but without limiting the scope of the invention regarding PFETs. First, the stressing layer is overlaying the FET in a fully non-conformal manner, which is preferable as this may be the configuration where the largest fraction of the stress from the stressing layer 10 is being imparted onto the channel 30. Full non-conformality by the stressing layer 10 means that sides of the gate 20 are substantially free of the stressing layer. Second, the gate 20 is void of any side walls 20', containing only the conducting electrode portion 20" itself. Having no sidewall is advantageous because the nearer the side edge 15 of the stressing layer 10 is to the gate electrode 20" and to the channel 30, the larger the stress that the stressing layer 10 can impart onto the channel 30. In embodiments of the invention these two properties may be used fully independently of each other, use of one neither implies, nor limits the use of the other.

As indicated in FIG. 1B, in exemplary embodiments of the present invention the stressing layer 10 preferably has a side edge 15, which is adjacent to the gate 20, and is running substantially in parallel with the gate 20. In FIG. 1B the stressing layer 10 is shown to actually touch the gate 20. This is a desirable arrangement because the nearer the side edge 15 is to the gate electrode 20" and channel 30, the larger is the stress induced in the channel 30. However, depending on fabricating conditions, the side edge 15 may, or may not, directly contact the gate 20.

In further discussions, and in further figures, details of the gate structure 20, for instance, electrode 20", or sidewall 20', will not be elaborated on, since any gate is compatible with embodiments of the present invention.

FIGS. 1A and 1B further show that the stressed layer 10 is in direct contact with the source or drain 40, or with the single crystal material 50. As one skilled in the art would know, the overlaying stressing layer 10 may, or may not, be actually touching these elements. It may occur that there are other, typically thin, material layers between the stressing layer 10 and source or drain 40, or substrate 50. Whether the stressed layer 10 is in direct contact with the source or drain 40, or there are other structures, or layers, in-between, is not significant for the embodiments of the invention. Lack of direct contact with the source or drain 40, or the substrate material 50, would not prevent the stressed layer 10 to impart the desired stress to the device channel 30.

Figure 2:
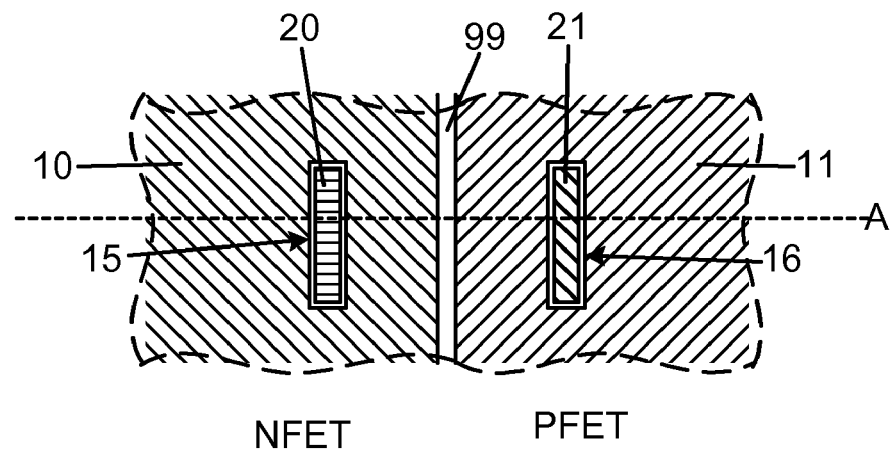
FIG. 2 shows a schematic top view of a representative embodiment of the invention.

FIG. 2 shows a schematic top view of a representative embodiment of the invention. The figure shows what typically may be only a small fraction of an electronic chip, for instance a processor, as indicated by the wavy dashed line boundaries. The device structure shows a NFET device and a PFET device of the least one NFET and least one PFET devices that may make up a device structure in embodiments of the invention. Typically NFET and PFET devices are coupled into CMOS configurations. Usually the devices are isolated from one another. In FIG. 2 a shallow trench 99 isolation scheme is shown, as this is a typical advanced isolation technique available in the art. However, as known in the art, often devices are "butted" against each other, and isolation, such as the trench 99, would be omitted. The figure is illustrative, in order to shows elements of the embodiment of the invention, rather then the fully processed FET devices.

For the gates, 20 and 21, the direction which is perpendicular to the cut line "A" is the width direction. During operation, the channel current flows in parallel with the cut line "A", which is the length, or longitudinal, direction of the gate. More often then not, in advanced electronic arts, the width of the gates is significantly larger than the length of the gates. The stress in the stressing layers, 10 and 11, affect the stress in the channels by their side edges, 15 and 16, along the width of the gates. In this disclosure, when the two sides of a gate is discussed, the two longer edges along the width direction are to be understood. In a representative embodiment, and as FIG. 2 shows, the stressing layers fully surround the gates, however such an arrangement is mainly due to the ease of fabrication. The stressing layer running along the width of the gate is causing the longitudinal stress in the channels.

The NFET gate 20 is surrounded by a highly stressed tensile stressing layer 10, which in a typical embodiment may be SiN. The stressing layer 10 preferably does not cover the gate 20. The stressing layer 10 has a side edge 15. This side edge 15 is located adjacently to, and runs substantially in parallel with the gate 20. The NFET gate 20 has two sides, and in exemplary embodiments of the invention a side edge 15 is located adjacently to, and substantially in parallel with each of the two sides of the gate 20. The tensile stress present in the stressing layer 10 imparts a tensile stress onto the channel underlying the gate 20. It may be preferable for the side edge 15 of the stressed layer 10 to be as close to the gate as possible, actually contacting the gate in typical embodiments. The nearer the side edge 15 is to the gate 20, the more effectively may the stressing layer 10 impart stress onto NFET channel underlying the gate 20.

For the PFET device the situation is symmetrically opposite to the one for the NFET device. The PFET gate 21 is surrounded by a highly stressed compressive stressing layer 11, which in a typical embodiment may also be SiN. In embodiments of this invention methods have been devised for depositing the same dielectric both in a tensile and in a compressive state. The stressing layer 11 has a side edge 16. This side edge 16 is located adjacently to, and runs substantially in parallel with the gate 21. The PFET gate 21 has two sides and in exemplary embodiments of the invention the side edge 16 is located adjacently to, and substantially in parallel with each of the two sides of the gate 21. The compressive stress present in the stressing layer 11 imparts a compressive stress onto the channel underlying the PFET gate 21. It may be preferable for the side edge 16 of the stressed layer 11 to be as close to the PFET gate 21 as possible, actually contacting the gate in typical embodiments. The nearer the layer side edge 16 is to the gate 21, the more effectively may the stressing layer 11 stress the PFET channel.

The cut line "A" shows where subsequent figures display the cross section of various structures of the embodiments for the present invention.

In the following discussions, each time an element of an NFET or a PFET device is discussed, it is prefixed with the device name. Hence, nomenclature such as, for instance, NFET source, or PFET channel, and similar ones for all device components is used.

Figure 3:
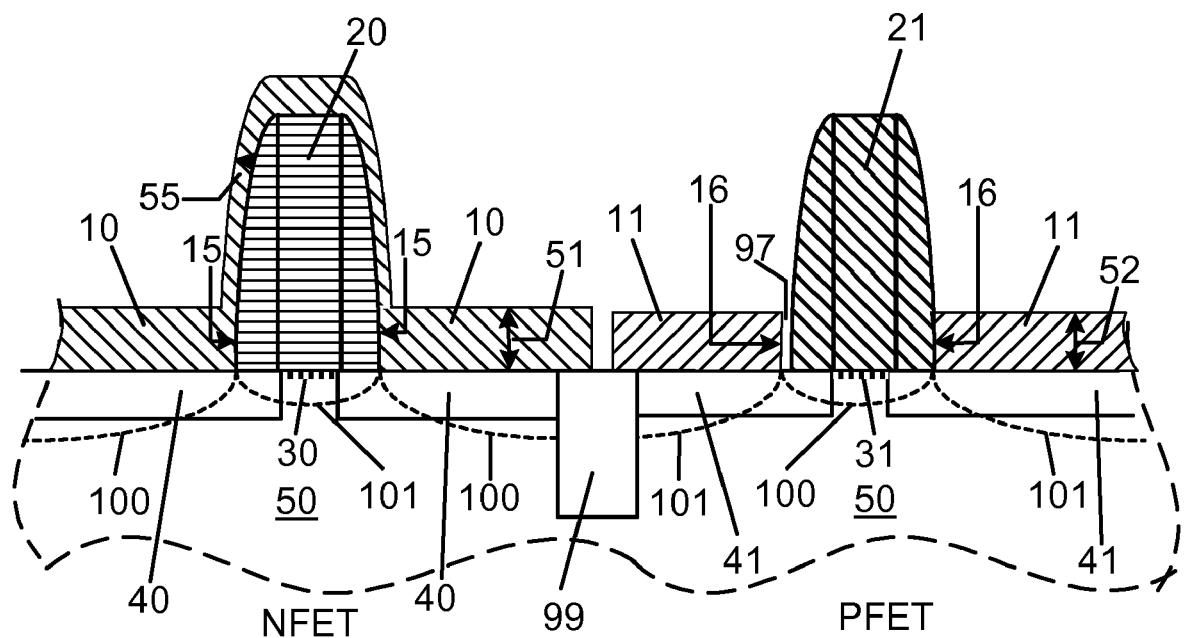
FIG. 3 shows in cross section a schematic view of a typical embodiment of the invention.

FIG. 3 shows in cross section a schematic view of a typical embodiment of the invention. In the depicted device structure a NFET device and a PFET device are shown of the least one NFET and least one PFET devices that may make up a device structure in embodiments of the invention. The devices may be isolated from one another by a shallow trench 99, as known in the art. The NFET device has a NFET gate, or gate structure, 20, NFET source and drain, each marked with indicator 40, since from the point of view of the embodiments of the invention it may not matter which one is which. The NFET channel 30 is capable to conduct an electron current between NFET source and drain. The substrate material, typically a single crystal Si based material 50 hosts the NFET channel 30. In an exemplary embodiment of the invention the Si based material 50 is essentially Si. The substrate may be any type known in the electronic art, such as bulk, or semiconductor on insulator (SOI), fully depleted, or partially depleted, or any other kind. Also, it may not necessarily be a Si based material, but an other type of semiconductor, for instance a III-V material, as know in the art.

A NFET stressing layer 10 is overlaying the NFET. The NFET stressing layer 10 is non-conformal in regard the NFET gate 20. The NFET stressing layer 10 has a side edge 15, located adjacently to both sides of the NFET gate 20. The NFET stressing layer 10 is in a tensile state of stress, and the material which is underneath the layer 10, is under compressive stress, as indicated by contour line 100. In the substrate material 50, along the line where the side edge 15 of the stressing layer 10 is located, the sign of the stress changes, and it turns into a tensile stress 101. In a representative embodiment of the invention the NFET channel 30 is recipient of the tensile 101 stress field emanating from the side edges 15 of the NFET stressing layer 10 from each side of the NFET gate 20.

The NFET part of FIG. 3 also symbolically illustrates the possibility that the stressing layer 10 is not perfectly non-conformal. The figure shows the stressing layer also covering the gate 20, including the sides of the gate. On the sides of the NFET gate 20 there is less coverage by the NFET stressing layer 10 than over the NFET source and drain 40. The coverage by the NFET stressing layer 10 on the sides of the NFET gate 20 would be less than about 50% of the coverage over the NFET source and drain 40. Less than 50% coverage means that the NFET stressing layer side thickness 55 on the side of the NFET gate 20 is less than about 50%, of the NFET thickness 51 over the NFET source and drain 40. Such a relatively small stressing layer side thickness 55 over the side of the gate 20, even if it were in a stressed state, it would not alter the effect on the NFET channel 30. As expressed earlier, the figure serves as a symbolic depiction of a non-conformal layer which is not perfectly formed. In an exemplary embodiment of the invention, one would find none, or only traces, of the NFET stressing layer 10 on the side of the NFET gate 20. The same discussion as presented for the NFET device holds also for the PFET device in regard to the degree of non-conformality of compressively PFET stressing layer 11 over PFET gate 21.

The PFET device in FIG. 3 is used to illustrate a full non-conformality of a stressing layer. However, this illustration by the PFET device is not intended to limit the scope of the invention regarding NFET devices. The PFET device has a PFET gate, or gate structure 21, PFET source and drain, each marked with indicator 41, since from the point of view of the embodiments of the invention it may not matter which one is which. The PFET channel 31 is capable to conduct a hole current between PFET source and drain 41. The substrate material, typically a single crystal Si based material 50 hosts the PFET channel 31. A PFET stressing layer 11 is overlaying the PFET, with a PFET thickness 52 over the PFET source and drain 41. The PFET stressing layer 11 is non-conformal in regard the PFET gate 21. The PFET stressing layer 11 has a side edge 16 located adjacently to both sides of the gate 21. The PFET stressing layer 11 is in a compressive state of stress, and the material which is underneath the layer 11, is under tensile stress, as indicated by contour line 101. In the substrate material 50, along the line where the side edge 16 of the PFET stressing layer 11 is located, the sign of the stress changes, and it turns into a compressive stress 100. In a representative embodiment of the invention the PFET channel 31 is recipient of the compressive 100 stress field emanating from the side edges 16 of the PFET stressing layer 11 from each side of the PFET gate 21.

The PFET part of FIG. 3 also symbolically illustrates the possibility that the side edge 16 of the PFET stressing layer 11 is not in direct contact with the PFET gate 21, but there is a gap 97 between the two. Depending on how the PFET stressing layer 11 is fabricated, such a gap might be formed. Still, the side edge 16 is capable to exert the appropriate stress into the PFET channel 31 of the device, and a device structure with such a gap is within the scope of the embodiments of the invention. The same discussion as presented for the PFET device holds also for the NFET device in regard to a possible gap between the NFET gate 20 and a fully non-conformal tensile NFET stressing layer 10.

In representative embodiments of the invention, the material of both the tensile NFET stressing layer 10 and the compressive PFET stressing layer 11 is the same material. This material in a typical embodiment may be SiN. Deposition techniques for SiN have been developed for both tensile and compressive layers.

Figure 4:
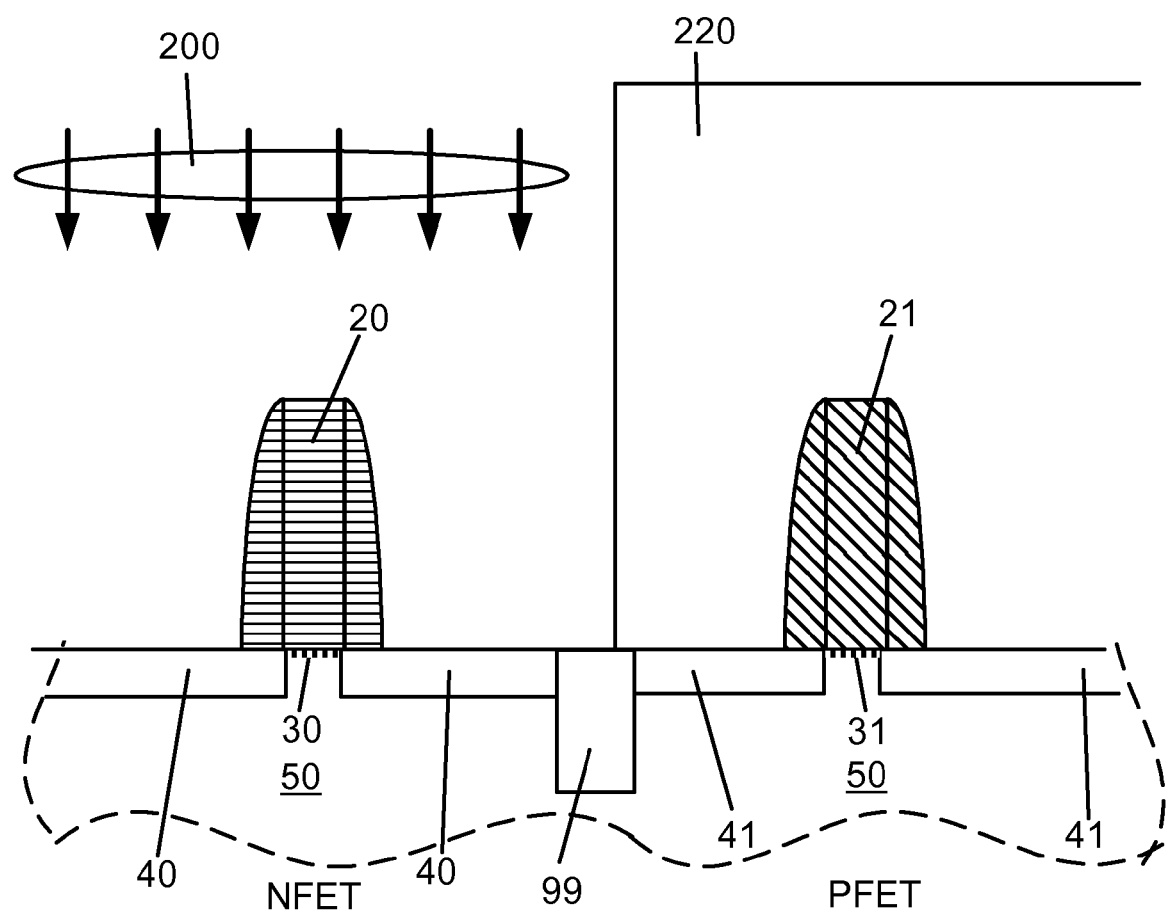
FIG. 4 shows in cross section a schematic view of processing steps, including non-conformal deposition.
Figure 5A:
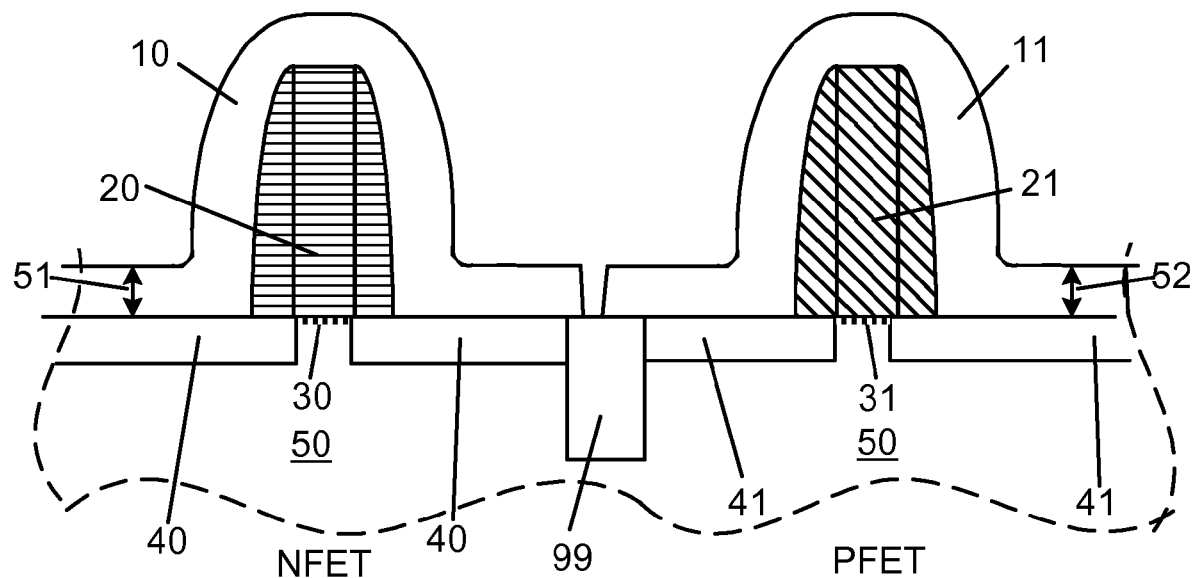
FIG. 5A shows in cross section a schematic view of processing steps, including conformal deposition.
Figure 5B:
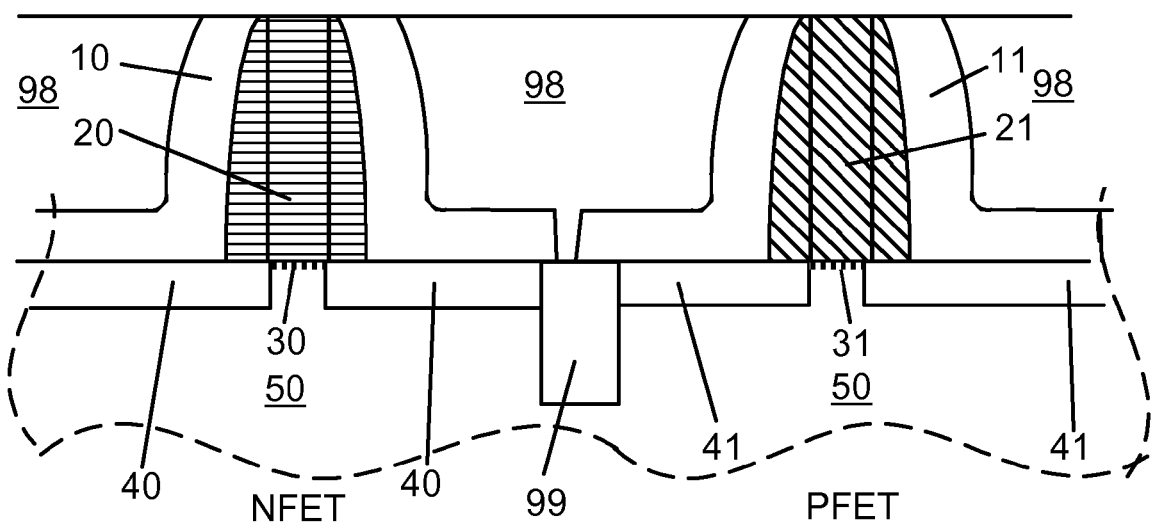
FIG. 5B shows in cross section a schematic view of processing steps, including covering and planarization.
Figure 5C:
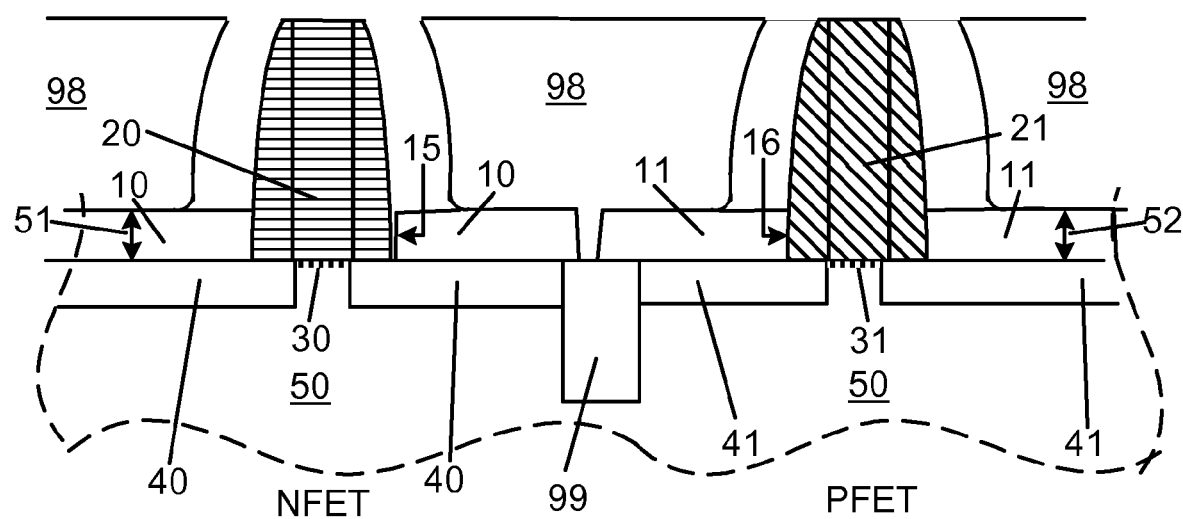
FIG. 5C shows in cross section a schematic view of processing steps, including etching of conformal layers.

The processing method for the devices preferably includes the fabrication of layers under stress, which layers then impart stress onto the channel. In order to fabricate the non-conformal stressing layers one may take several possible routes. For instance, one may deposit the desired stressing layer by a technique which leads to non-conformal layers. In an alternate approach, one may deposit the layers in a conformal manner, and afterwards turn them into non-conformal ones. FIG. 4 depicts the method of the non-conformal deposition approach, and FIGS. 5A-5C show the conformal to non-conformal conversion approach.

Manufacturing of NFET, PFET, and CMOS is very well established in the art. It is understood that there are large number of steps involved in such processing, and each step might have practically endless variations known to those skilled in the art. In this disclosure it is understood that the whole range of known processing techniques are available for fabricating the devices, and only those process steps will be detailed that are related to the elements of the present invention.

FIG. 4 shows in cross section a schematic view of processing steps including non-conformal deposition. This figure shows the method for manufacturing the FET devices at the stage where several elements of the devices, including the gates have already been fabricated, and the structures are awaiting to receive the stressing layers. In exemplary embodiments of the invention one of the two type of transistors, in FIG. 4 the PFET, is masked 220, and the other type of device, in FIG. 4 the NFET, receive the deposition of the stressing material by a non-conformal deposition technique 200. Such preferred techniques may be high density plasma (HDP) deposition, or plasma enhanced chemical vapor deposition (PECVD). They both are directional as schematically indicated 200 with arrows in FIG. 4, and, as such, do not deposit on nearly vertical surfaces like the sides of the gate 20. The methods of HDP and PECVD have been used to deposit both compressive and tensile stressing layers. For the NFET devices the deposition 200 is producing tensile layers. Having done the deposition on one type of device, the masking is reversed, and the non-conformal deposition of the stressing layer, with the opposite state of stress, is processed for the other type of device.

Alternatively, the masking schemes may be done in a reverse fashion. One may deposit the tensile film everywhere, then apply a mask to cover the NFET, and etch the tensile film from the PFET. Following, one may remove the mask, deposit the compressive layer everywhere, and then apply a mask to protect the compressive film over the PFET, while it is etched away from over the NFET. Finally, one may remove the second mask. Discussing such details in the fabrication of the PFET and NFET devices, should not be read in limiting fashion. All possible fabrications of the doubly stressed structure are within the scope of the present disclosure. The materials that may be used for stressing layer deposition include dielectrics, such as the preferred SiN, and others, such as $SiO_2$, SiON, or, possibly metals as well, such as W, TaN, TiN, and others.

After these non-conformal depositions the device structure is in a state as shown in FIGS. 2 and 3. Processing from this stage on, including interconnections for the manufacturing a functional electronic chip, may proceed by methods known to those skilled in the art.

Compressive stresses as higher than −3 GPa, and possibly as high as −5 GPa, and tensile stress in the range of 0.8 GPa to 3 GPa can be achieved by HDP deposition of SiN, for excellent non-conformal layers. The parameters of a preferred deposition, and the differentiation between depositing compressive or tensile layer, include the following. Higher plasma power typically increases compression in PECVD and HDP films, while CVD films tend to be tensile in the range of about 1.2 GPa. Similarly, the PECVD technique may be capable to reach compressive and tensile stresses in the range of 0.8 GPa to 1.2 GPa. Exemplary techniques of PECVD, of chemical vapor deposition (CVD), and of HDP for depositing compressively and tensilely stressed SiN layers may include deposition parameter choices as presented in the commonly owned U.S. patent application Ser. No. 10/536,483, (publication US 20060057787), incorporated herein be reference.

There may be variations on such processes to enhance the non-conformality of the deposited SiN. In an exemplary PECVD process the pressure may be increased from 2 torr to the 8 torr to 10 torr range. This change results in layers with less than 50% conformality. Furthermore decreasing temperature also yields more non-conformal deposition, decreasing conformality by about 1% for every 10° C. temperature change. An alternate approach to achieve non-conformality is to use a higher density plasma as the source, and working with a low pressure in the chamber, of around 2 mtorr. Also, coupling the plasma source inductively instead of capacitively was observed to create non-conformal SiN layers.

FIGS. 5A-5C show the fabrication approach where the deposition of the stressed layers proceeds in a conformal manner, and after these depositions the conformal layers are converted into non-conformal layers.

FIG. 5A shows in cross section a schematic view of processing steps including conformal deposition. Having performed the necessary masking and mask-removing steps, after the deposition of conformal stressed layers 10, 11, the resulting device structures may appear as depicted in FIG. 5A. By using deposition techniques which may be capable of conformal deposition, such as CVD, ultra high vacuum chemical vapor deposition (UHCVD), stresses in the range of +/−(0.8 GPa to 3 GPa) may be achieved with SiN, and with other suitable layers as taught above. Since the deposition is conformal, above the layers 10, 11, one has similar coverage over the sides of the gates 20, 21 as there is over the sources and drains 40, 41. This coverage of the stressing layers 10, 11 on the sides of the gates 20, 21 lessens the amount of stress imparted onto the channels. Consequently, the portion of the stressing layers 10, 11 which is conformal may need to be removed.

FIG. 5B shows in cross section a schematic view of processing steps including covering and planarization. A suitable dielectric cover layer 98, such as $SiO_2$, is blanket deposited, for instance by HDP. Following deposition, the cover layer 98 is differentially etched, or polished, in order to expose the conformal portions of the stressed layers 10, 11. This is at the stage of processing as depicted on FIG. 5B.

FIG. 5C shows in cross section a schematic view of processing steps including etching of conformal layers. Using appropriate wet of dry etching, such as $CHF_3$ or $CF_4$, the stressing layers 10, 11 are removed from the sides of the gates 20, 21. The result of this operation is that now the stressed layers are non-conformal, leaving the sides of the gates 20, 21 essentially free of the stressed dielectric material, typically SiN. FIG. 5C shows this stage, while the cover layer 98 is still in place. In later processing steps the cover layer 98 may be removed, as well, after which the structures processed in this manner, again, may be at the stage as shown in FIGS. 2 and 3.

It is understood that any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as "above," "side," "on", "over" and similar ones, as used herein refer to relative location and orientation of various portions of the structures with respect to one another, and are not intended to suggest that any particular absolute orientation with respect to external objects is necessary or required.

Figure 6:
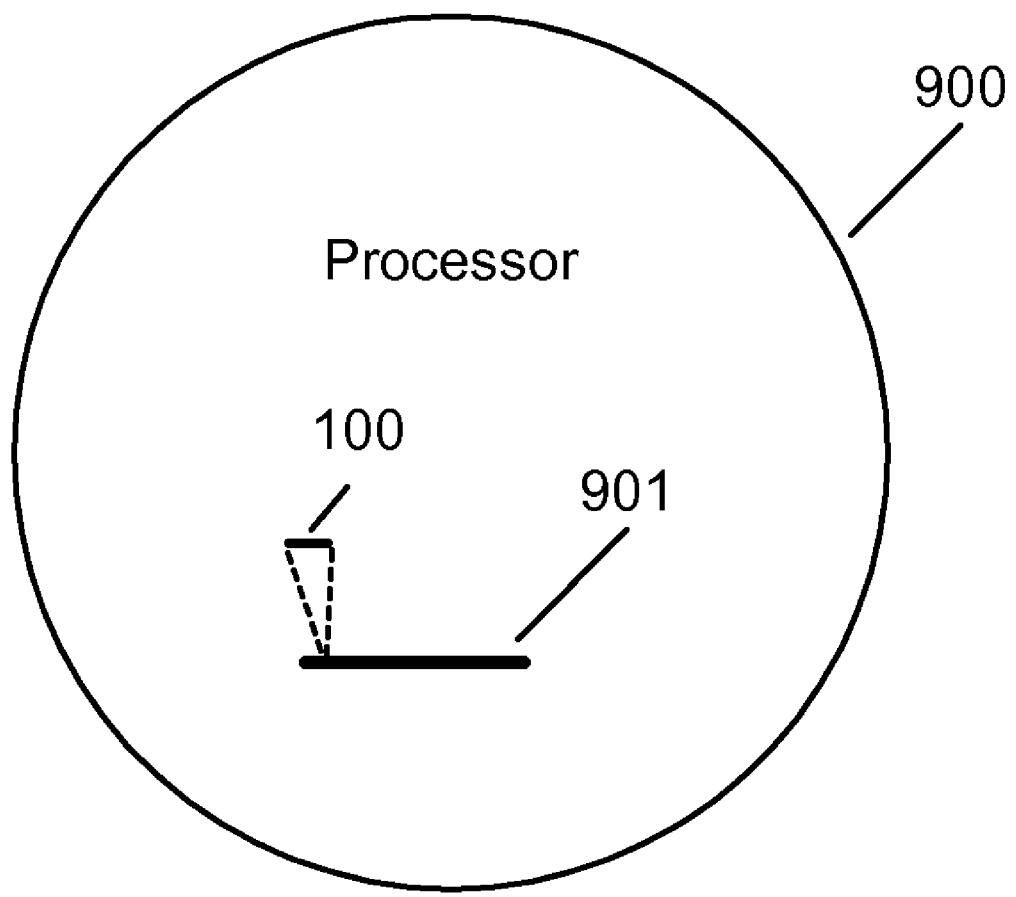
FIG. 6 shows a symbolic view of a processor containing at least one FET transistor with a stressed channel.

FIG. 6 shows a symbolic view of a processor containing at least one FET transistor with a stressed channel. Such a processor 900 has at least one chip 901, which contains at least one FET 100, which has a channel stressed due to a non-conformal stressing layer overlaying the FET. The processor 900 may be any processor which can benefit from the stressed channel device 100. Representative embodiments of processors manufactured with such stressed channel devices are digital processors, typically found in the central processing complex of computers; mixed digital/analog processors, typically found in communication equipment; and others.

Many modifications and variations of the present invention are possible in light of the above teachings, and could be apparent for those skilled in the art. The scope of the invention is defined by the appended claims.

We claim:

1. A method for producing a field effect transistor (FET), comprising:
    fabricating a gate structure for said FET, wherein said gate structure has sidewalls, and said FET has a source and a drain;
    overlaying said gate structure and said source and said drain with a stressing layer using a conformal deposition technique;
    depositing a cover layer over said stressing layer;
    removing said cover layer above said gate structure, therein exposing said stressing layer above said gate structure; and
    removing completely said stressing layer from said gate structure including said sidewalls, whereby said stressing layer is overlaying only said source and said drain.

2. The method of claim 1, wherein said stressing layer is selected to be essentially silicon nitride (SiN).

3. A method for producing a device structure, comprising:
    fabricating an N-gate structure for at least one NFET of said device structure, wherein said N-gate structure has sidewalls;
    fabricating a P-gate structure for at least one PFET of said device structure, wherein said P-gate structure has sidewalls;
    ensuing said fabricating said N-gate structure and said P-gate structure, depositing NFET and PFET stressing layers by conformal deposition techniques over said at least one NFET and over said at least one PFET;

depositing a cover layer over said NFET and PFET stressing layers;
removing said cover layer above said N-gate structure and above said P-gate structure, therein exposing said NFET and PFET stressing layers above said N-gate structure and above said P-gate structure; and
removing completely said NFET and PFET stressing layers from said N-gate structure including said N-gate structure sidewalls, and from said P-gate structure including said P-gate structure sidewalls.

4. The method of claim 3, wherein both said NFET and PFET stressing layers are selected to be essentially of silicon nitride(SiN).

* * * * *